United States Patent
Berry

(10) Patent No.: US 7,888,955 B2
(45) Date of Patent: Feb. 15, 2011

(54) METHOD AND APPARATUS FOR TESTING DEVICES USING SERIALLY CONTROLLED RESOURCES

(75) Inventor: Tommie Edward Berry, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 230 days.

(21) Appl. No.: 11/861,223

(22) Filed: Sep. 25, 2007

(65) Prior Publication Data

US 2009/0079448 A1    Mar. 26, 2009

(51) Int. Cl.
*G01R 31/02* (2006.01)

(52) U.S. Cl. ..................... 324/754
(58) Field of Classification Search ............. 324/158.1, 324/754–765
See application file for complete search history.

(56) References Cited

U.S. PATENT DOCUMENTS

| | | | |
|---|---|---|---|
| 3,781,683 A | 12/1973 | Freed | |
| 3,827,820 A | 8/1974 | Hoffman | |
| 4,038,599 A | 7/1977 | Bove et al. | |
| 4,455,654 A | 6/1984 | Bhaskar et al. | |
| 4,465,972 A * | 8/1984 | Sokolich | 324/754 |
| 4,468,616 A | 8/1984 | Yoshizaki | |
| 4,523,144 A | 6/1985 | Okubo et al. | |
| 4,706,018 A | 11/1987 | Beha et al. | |
| 4,780,670 A | 10/1988 | Cherry | |
| 4,837,622 A | 6/1989 | Whann et al. | |
| 4,899,099 A | 2/1990 | Mendenhall | |
| 5,070,297 A | 12/1991 | Kwon | |
| 5,090,118 A | 2/1992 | Kwon et al. | |
| 5,103,557 A | 4/1992 | Leedy | |
| 5,148,103 A | 9/1992 | Pasiecznik, Jr. | |
| 5,162,728 A | 11/1992 | Huppenthal | |
| 5,172,050 A | 12/1992 | Swapp | |
| 5,187,020 A | 2/1993 | Kwon et al. | |
| 5,191,708 A | 3/1993 | Kasukabe et al. | |
| 5,243,274 A | 9/1993 | Kelsey et al. | |
| 5,261,155 A | 11/1993 | Angulas et al. | |
| 5,323,107 A | 6/1994 | D'Souza | |
| 5,357,523 A | 10/1994 | Bogholtz, Jr. et al. | |
| 5,363,038 A | 11/1994 | Love | |
| 5,367,254 A | 11/1994 | Faure et al. | |
| 5,389,556 A | 2/1995 | Rostoker et al. | |
| 5,406,210 A | 4/1995 | Pedder | |

(Continued)

FOREIGN PATENT DOCUMENTS

DE    9004562    8/1990

(Continued)

OTHER PUBLICATIONS

International Search Report and Written Opinion mailed Mar. 2, 2009 for PCT Application No. PCT/US2008/077585.

*Primary Examiner*—Ha Tran T Nguyen
*Assistant Examiner*—Joshua Benitez
(74) *Attorney, Agent, or Firm*—Kirton & McConkie

(57) ABSTRACT

Methods and apparatus for testing devices using serially controlled resources have been described. Examples of the invention can relate to an apparatus for testing a device under test (DUT). In some examples, an apparatus can include an integrated circuit (IC) having a serialized input coupled to test circuits, the test circuits selectively communicating test signals with the DUT responsive to a test control signal on the serialized input.

18 Claims, 4 Drawing Sheets

U.S. PATENT DOCUMENTS

| | | | |
|---|---|---|---|
| 5,422,574 A | 6/1995 | Kister | |
| 5,434,513 A | 7/1995 | Fujii et al. | |
| 5,442,282 A | 8/1995 | Rostoker et al. | |
| 5,476,211 A | 12/1995 | Khandros | |
| 5,479,105 A | 12/1995 | Kim et al. | |
| 5,491,426 A | 2/1996 | Small | |
| 5,495,667 A | 3/1996 | Farnworth et al. | |
| 5,497,079 A | 3/1996 | Yamada et al. | |
| 5,532,610 A | 7/1996 | Tsujide et al. | |
| 5,534,784 A | 7/1996 | Lum et al. | |
| 5,541,505 A * | 7/1996 | Azumai | 324/158.1 |
| 5,568,054 A * | 10/1996 | Iino et al. | 324/760 |
| 5,570,032 A | 10/1996 | Atkines et al. | |
| 5,600,257 A | 2/1997 | Leas et al. | |
| 5,625,297 A | 4/1997 | Arnaudov et al. | |
| 5,642,054 A | 6/1997 | Pasiecznik, Jr. | |
| 5,648,661 A | 7/1997 | Rostoker et al. | |
| 5,669,774 A | 9/1997 | Grabbe | |
| 5,670,889 A | 9/1997 | Okubo et al. | |
| 5,686,842 A | 11/1997 | Lee | |
| 5,701,085 A | 12/1997 | Malladi et al. | |
| 5,701,666 A | 12/1997 | DeHaven et al. | |
| 5,736,850 A | 4/1998 | Legal | |
| 5,764,072 A | 6/1998 | Kister | |
| 5,772,451 A | 6/1998 | Dozier, II et al. | |
| 5,806,181 A | 9/1998 | Khandros et al. | |
| 5,821,763 A | 10/1998 | Beaman et al. | |
| 5,829,128 A | 11/1998 | Eldridge et al. | |
| 5,832,601 A | 11/1998 | Eldridge et al. | |
| 5,834,946 A | 11/1998 | Albrow et al. | |
| 5,838,163 A | 11/1998 | Rostoker et al. | |
| 5,864,946 A | 2/1999 | Eldridge et al. | |
| 5,878,486 A | 3/1999 | Eldridge et al. | |
| 5,884,398 A | 3/1999 | Eldridge et al. | |
| 5,897,326 A | 4/1999 | Eldridge et al. | |
| 5,900,738 A | 5/1999 | Khandros et al. | |
| 5,917,707 A | 6/1999 | Khandros et al. | |
| 5,974,662 A | 11/1999 | Eldridge et al. | |
| 5,983,493 A | 11/1999 | Eldridge et al. | |
| 5,998,228 A | 12/1999 | Eldridge et al. | |
| 6,029,344 A | 2/2000 | Khandros et al. | |
| 6,032,356 A | 3/2000 | Eldridge et al. | |
| 6,059,982 A | 5/2000 | Palagonia et al. | |
| 6,064,213 A | 5/2000 | Khandros et al. | |
| 6,110,823 A | 8/2000 | Eldridge et al. | |
| 6,133,744 A | 10/2000 | Yojima et al. | |
| 6,174,744 B1 | 1/2001 | Watanabe et al. | |
| 6,219,908 B1 | 4/2001 | Farnworth et al. | |
| 6,275,051 B1 | 8/2001 | Bachelder et al. | |
| 6,316,988 B1 | 11/2001 | Forehand et al. | |
| 6,400,173 B1 | 6/2002 | Shimizu et al. | |
| 6,500,257 B1 | 12/2002 | Wang et al. | |
| 6,525,555 B1 | 2/2003 | Khandros et al. | |
| 6,535,555 B1 | 3/2003 | Bordes et al. | |
| 6,649,931 B2 | 11/2003 | Honma et al. | |
| 6,655,023 B1 | 12/2003 | Eldridge et al. | |
| 6,691,055 B2 * | 2/2004 | Walter et al. | 702/107 |
| 6,781,908 B1 | 8/2004 | Pelley et al. | |
| 6,788,094 B2 | 9/2004 | Khandros et al. | |
| 6,856,150 B2 | 2/2005 | Sporck et al. | |
| 7,078,926 B2 | 7/2006 | Khandros et al. | |
| 7,116,119 B2 | 10/2006 | Sporck et al. | |
| 7,245,134 B2 | 7/2007 | Granicher et al. | |
| 7,307,433 B2 | 12/2007 | Miller et al. | |
| 7,345,493 B2 | 3/2008 | Khandros et al. | |
| 7,750,652 B2 * | 7/2010 | Campbell | 324/754 |
| 2003/0107394 A1 | 6/2003 | Khandros et al. | |
| 2004/0068869 A1 | 4/2004 | Eldridge et al. | |
| 2004/0117705 A1 * | 6/2004 | Zounes | 714/726 |
| 2006/0273809 A1 | 12/2006 | Miller et al. | |
| 2007/0013401 A1 | 1/2007 | Khandros et al. | |
| 2009/0085590 A1 * | 4/2009 | Berry et al. | 324/754 |

FOREIGN PATENT DOCUMENTS

| | | |
|---|---|---|
| EP | 047141 | 3/1982 |
| EP | 699912 | 3/1996 |
| EP | 708338 | 4/1996 |
| FR | 2645679 | 10/1990 |
| JP | 02-159585 | 6/1990 |
| JP | 06-180342 | 6/1994 |
| JP | 07-111283 | 4/1995 |
| JP | 08-37215 | 2/1996 |
| JP | 08-50162 | 2/1996 |
| JP | 8037215 A | 2/1996 |
| JP | 08/129053 | 5/1996 |
| JP | 08-184612 | 7/1996 |
| WO | 91/12706 | 8/1991 |
| WO | 95/14314 | 5/1995 |
| WO | 96/08056 | 3/1996 |
| WO | 96-15459 | 5/1996 |
| WO | 98-01906 | 1/1998 |

* cited by examiner

METHOD AND APPARATUS FOR TESTING DEVICES USING SERIALLY CONTROLLED RESOURCES

BACKGROUND OF THE INVENTION

1. Field of the Invention

Embodiments of the present invention generally relate to wafer probe cards for testing semiconductor devices and, more specifically, to enhancing the performance of wafer probe cards.

2. Description of the Related Art

Testing is an important step in the production of semiconductor devices for use. Typically, partially or fully completed semiconductor devices may be tested by bringing terminals disposed on an upper surface of a device to be tested—also referred to as a device under test (or DUT)—into contact with resilient contact elements, for example, as contained in a probe card assembly, as part of a test system. A test system controller may be coupled to the probe card assembly to send and receive test signals to and from the DUTs over a set of test channels. A test system controller with increased test channels can be a significant cost factor for a test system. Test system controllers have evolved to increase the number of channels and hence the number of devices that can be tested in parallel (sometimes referred to as multi-site testing). Unfortunately, the number of DUTs per wafer has typically outpaced the development of test system controllers. Conventionally, available channels are typically inadequate for testing all DUTs on a wafer at the same time.

Some test systems may have common test signals per site in a multi-site test configuration. Common test signals (sometimes referred to as global test signals) are test signals that can be applied to a plurality of DUTs being tested in a single touchdown. One technique to accommodate testing of components on a wafer with a limited number of test channels is to fan out a signal from a test system controller in the probe card assembly to multiple transmission lines. That is, a test signal normally provided to a single DUT can be fanned out to multiple DUTs in the probe card assembly. This technique can enable testing of an increased number of DUTs contemporaneously during a single touchdown for a fixed number of test system channels.

As the number of DUTs tested in a single touchdown increases, fanning out global signals from the test system controller becomes difficult to implement, if not impractical. The more DUTs that are tested simultaneously, the more fan out lines required on the probe card assembly. Including several thousands of lines on a probe card assembly is undesirable in terms of the required area and complexity of the components of the probe card assembly and in terms of cost.

Accordingly, there exists a need in the art for a method and apparatus for testing semiconductor devices that attempts to overcome at least some of the aforementioned deficiencies.

SUMMARY OF THE INVENTION

Embodiments of the invention can relate to an apparatus for testing a device under test (DUT). In some embodiments, an apparatus can include an integrated circuit (IC) having a serialized input coupled to test circuits, the test circuits selectively communicating test signals with the DUT responsive to a test control signal on the serialized input.

Embodiments of the invention can relate to a probe card assembly. In some embodiments, a probe card assembly can include at least one serial control line providing a respective at least one test control signal, and a plurality of integrated circuits (ICs) serially coupled to form a chain, the chain coupled to the at least one serial control line, the plurality of ICs selectively communicating test signals between test resources and test probes responsive to the at least one test control signal.

Embodiments of the invention can relate to a test assembly. In some embodiments, a test assembly can include a printed wiring board including connectors for connecting to a test system controller, and at least one serial control line providing a respective at least one test control signal from the test system controller; and a probe head supporting test probes and at least one integrated circuit (IC) coupled to the at least one serial control line, the at least one IC selectively communicating test signals between test resources and test probes responsive to the at least one test control signal.

Embodiments of the invention can relate to a method of testing components on a wafer using a probe card assembly. In some embodiments, a method of testing components on a wafer using a probe card assembly can include serially shifting a test control signal through a chain comprising a plurality of integrated circuits (ICs); selectively coupling test signals from test resources to test probes responsive to the test control signal; capturing test result signals at the test resources from the test probes; and serially reading back from the chain to obtain the test result signals.

BRIEF DESCRIPTION OF THE DRAWINGS

So that the manner in which features of the various embodiments of the present invention can be understood in detail, a more particular description of the invention, briefly summarized above and described more fully below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images used in the drawings are simplified for illustrative purposes and are not necessarily depicted to scale.

DETAILED DESCRIPTION

The present invention provides methods and apparatus for testing devices using serially controlled resources. The resources may be included in ICs, which may be coupled to form one or more serial chains of ICs. The resources in an IC may be of different types. Each of the resources may be independently controlled using one or more serial interfaces to each of ICs. For example, a single serial control line may be used to control a multiplicity of resources, which may be of different types. By serial, it is meant that signals on a serial control line may be transmitted as a sequential bit stream (i.e., transmitted bit-by-bit). The resources may be used as a source of test signals for a plurality of devices, as a sink of test signals from a plurality of devices, or as a source and a sink of test signals. The use of one or more serial control lines to control a multiplicity of resources may substantially reduce the number of conductors required on a probe card assembly. These and other aspects and embodiments of the invention are described in detail below.

Figure 1:
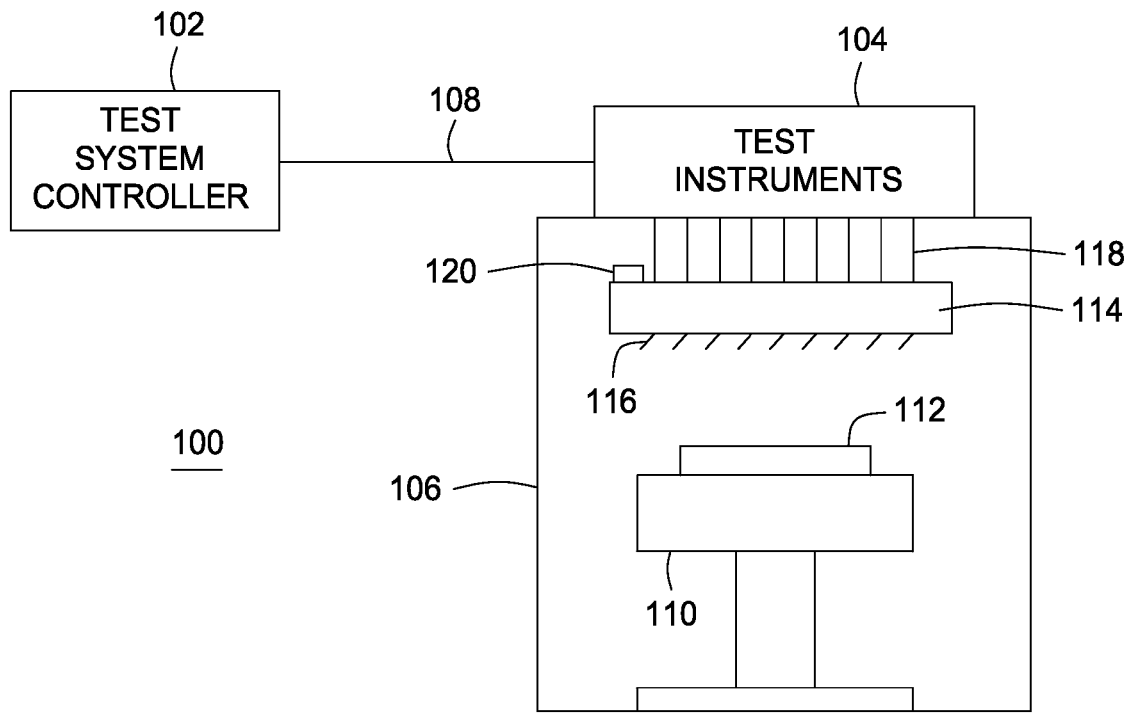
FIG. 1 is a block diagram depicting a test system according to some embodiments of the invention.

FIG. 1 is a block diagram depicting a test system 100 according to some embodiments of the invention. The test system 100 can generally include a test system controller 102, test instruments 104, and a prober 106. The test system controller 102 can be coupled to the test instruments 104 by a communication link 108. The prober 106 can include a stage 110 for mounting a device under test (DUT) 112 being tested and a probe card assembly 114. The DUT 112 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices. The probe card assembly 114 can include probes 116 (also referred to as test probes) that contact the DUT 112. The stage 110 can be movable to contact the DUT 112 with probes 116.

The probe card assembly 114 can include electronics 120 for providing a source of test signals to the DUT 112, a sink of test signals from the DUT 112, or both a source and a sink of test signals to and from the DUT 112. A source or sink of a test signal may be referred to herein as a test resource or resource. In some embodiments, the electronics 120 can include one or more chains of test resources. Each chain of test resources is controlled serially using a serial control signal referred to herein as a test control signal. Note the difference between a test signal and a test control signal. A test signal is a signal ultimately applied to the DUT 112 for purposes of testing or a signal received from the DUT 112 in response to testing. A test control signal is a signal that controls some test resources in the electronics 120 to provide a source or a sink of test signals. The chain(s) of test resources may be implemented using one or more chains of ICs. Aspects of the test resources and IC implementations thereof are described below.

In the test system 100, test signals can be transmitted by the electronics 120 to the DUT 112 through the probes 116. Test signals can be received by the electronics from the DUT 112 through the probes 116. The transmission and/or reception of test signals by the electronics 120 may be controlled by the test instruments 104. Some of the test resources in the electronics 120 can generate test signals (e.g., digital or analog data signals) in response to one or more test control signals, which are provided by the test instruments 104. The test instruments 104 can also generate test signals (e.g., supply voltage signals), which are in turn coupled to the electronics 120. Others of the test resources can provide a controllable source of these test signals generated by the test instruments 104 in response to one or more test control signals, which may also be provided by the test instruments 104. The test instruments 104 can also generate test signals, which are, in turn, coupled directly to some of the probes 116 (e.g., bypassing the electronics 120).

The test instruments 104 may be controlled by the test system controller 102 (e.g., a general purpose computer). Test signals received by the electronics 120 from the DUT 112 may be referred to as test results. Test results can be provided from the electronics 120 to the test instruments 104. The test instruments 104 may transmit the test results to the test system controller 102 for analysis.

The test instruments 104 may be linked by connectors 118 to the probe card assembly 114. The links provided by the connectors 118 can be divided into individual test channels. The test channels may be used to convey test control signals or test signals (including test results). The connectors 118 may be any suitable connectors, such as flexible cable connectors, pogo pins, zero insertion force (ZIF) connectors, or the like. The probe card assembly 114 can fan out one or more of the test channels such that the signal conveyed therein can be coupled to multiple components.

Figure 2:
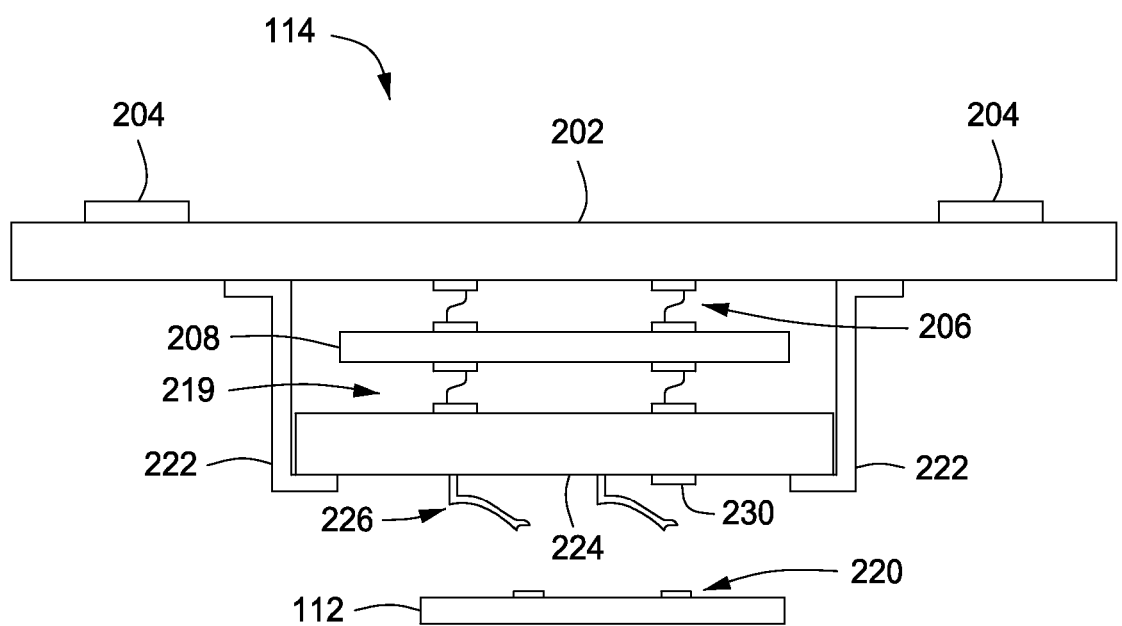
FIG. 2 depicts the probe card assembly according to some embodiments of the invention.

FIG. 2 depicts the probe card assembly 114 according to some embodiments of the invention. The probe card assembly 114 generally acts as an interface between the test instruments 104 and the DUT 112. The probe card assembly 114 can include electrical connectors 204 configured to make electrical connections with a plurality of test channels (not shown) from the test instruments 104. The probe card assembly 114 can also include one or more resilient contact elements 226 as test probes. The resilient contact elements 226 can be configured to be pressed against, and thus make temporary electrical connections with, one or more input and/or output terminals 220 of the DUT 112. The resilient contact elements 226 are typically configured to correspond to desired terminals 220 of the DUT 112 and may be arranged in one or more arrays having a desired geometry.

The probe card assembly 114 may include one or more substrates configured to support the connectors 204 and the resilient contact elements 226 and to provide electrical connections therebetween. The exemplary probe card assembly 114 shown in FIG. 2 has three such substrates, although in other implementations, the probe card assembly 114 can have more or fewer substrates. In the embodiment depicted in FIG. 2, the probe card assembly 114 includes interconnect, such as a wiring substrate 202 (also referred to as a printed wiring board), a compliant interposer substrate 208, and a probe substrate 224 (also referred to as a probe head). The wiring substrate 202, the interposer substrate 208, and the probe substrate 224 can generally be made of any type of suitable material or materials, such as, without limitation, printed circuit boards, ceramics, organic or inorganic materials, and the like, or combinations thereof.

Additionally, the probe card assembly 114 may include one or more active or passive electronic components (such as capacitors, resistors, and the like). In some embodiments, one or more ICs 230 having test resources can be disposed on the wiring substrate 202. In other embodiments, the ICs 230 may be disposed on the interposer 408. In still other embodiments, the ICs 230 may be disposed on the probe substrate 224 along with the resilient contact elements 226. In other embodiments, the ICs 230 can be disposed on any combination of one or more of the wiring substrate 202, the interposer substrate 208, and the probe substrate 224.

Some electrically conductive paths (not shown) can be provided from the connectors 204 through the various substrates to the ICs 230. Other electrically conductive paths (not shown) can be provided from the connectors 204 through the various substrates to the resilient contact elements 226. Still other electrically conductive paths (not shown) can be provided from the ICs 230 to the resilient contact elements 226. For example, in the embodiment depicted in FIG. 2, electrically conductive paths (not shown) may be provided from the connectors 204 through the wiring substrate 202 to a plurality of electrically conductive spring interconnect structures 206. Other electrically conductive paths (not shown) may be provided from the spring interconnect structures 206 through the interposer substrate 208 to a plurality of electrically conductive spring interconnect structures 219. Still other electrically conductive paths (not shown) may further be provided from the spring interconnect structures 219 through the probe substrate 224 to the ICs 230, to the resilient contact elements 226, or both. Still other electrically conductive paths (not shown) may further be provided from the ICs 230 to the resilient contact elements 226. The electrically conductive paths through the wiring substrate 202, the interposer substrate 208, and the probe substrate 224 can comprise electrically conductive vias, traces, or the like, that may be disposed on, within, and/or through the wiring substrate 202, the interposer substrate 208, and the probe substrate 224.

The wiring substrate 202, the interposer substrate 208, and the probe substrate 224 may be held together by one or more brackets 222 and/or other suitable means (such as by bolts, screws, or other suitable fasteners). The configuration of the probe card assembly 114 shown in FIG. 2 is exemplary only and is simplified for ease of illustration and discussion and many variations, modifications, and additions are contemplated. For example, a probe card assembly may have fewer or more substrates (e.g., 202, 208, 224) than the probe card assembly 114 shown in FIG. 2. As another example, a probe card assembly may have more than one probe substrate (e.g., 224), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 114 shown in FIG. 2 and that the probe card assemblies described in the aforementioned patents and application may benefit from the use of the inventive intelligent switches and their configurations described herein.

Figure 3:
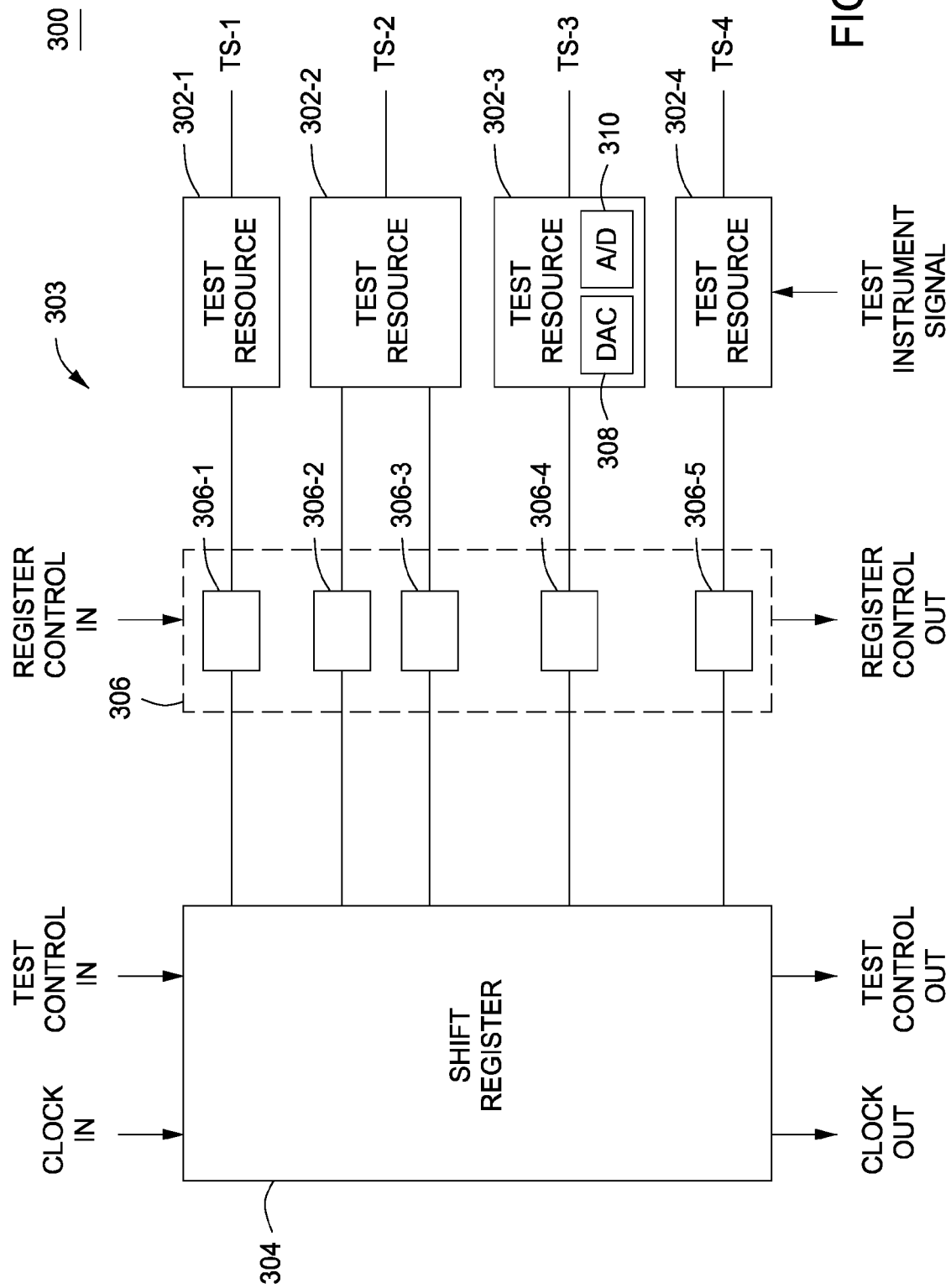
FIG. 3 is a circuit diagram depicting a control group of test resources according to some embodiments of the invention.

FIG. 3 is a circuit diagram depicting a control group 300 of test resources according to some embodiments of the invention. The control group 300 may be a portion of a chain of test resources. That is, a chain of test resources may include multiple serially connected instances of the control group 300. The control group 300 can include a plurality of test resources 302 (test resources 302-1 through 302-4 are shown) and control logic 303. The control logic 303 may include a shift register 304 and a plurality of shadow registers 306 (shadow registers 306-1 through 306-5 are shown). The shift register 304 can include a clock input, a test control input, a clock output, and a test control output. The shadow registers 306 can include a register control input and a register control output.

The shift register 304 can be a serial in/out, parallel out/in circuit. That is, bits of a test control signal can be serially shifted in the test control input. The sequence of bits stored in the shift register 304 is referred to herein as a frame. A test control input may include multiple sequential frames that can be serially shifted through a chain of control groups. Accordingly, bits of the test control signal can be serially shifted out of the test control output of the shift register 304 to another control group. The shift register 304 can include parallel terminals respectively coupled to the shadow registers 306. A frame stored in the shift register 304 can be shifted out in parallel to the shadow registers 306. Accordingly, a sufficient number of the shadow registers 306 may be provided to store all bits in a frame. Conversely, the contents of the shadow registers 306 may be shifted in parallel into the shift register 304.

The shadow registers 306 may each include two data ports, which may be bidirectional. One data port of each of the shadow registers 306 can be coupled to one of the parallel terminals of the shift register 304, as described above. The other data ports of the shadow registers 306 can be coupled to control ports of the test resources 302. One or more of the shadow registers 306 can be coupled to a respective one or more control ports of a given test resource. For example, the shadow register 306-1 can be coupled to the test resource 302-1. The shadow registers 306-2 and 306-3 can be coupled to the test resource 302-2. The shadow register 306-4 can be coupled to the test resource 302-3. The shadow register 306-5 can be coupled to the test resource 302-4. The embodiment shown in FIG. 3 is one of a myriad of possible embodiments of connections between shadow registers and test resources.

The test resources 302 may include various types of circuits and logic components, such as transistors, logic gates, flip-flops, comparators, operational amplifiers, and the like to provide, at least, the sourcing, sinking, or both of test signals. The test resources 302 can perform the sourcing, sinking, or both of test signals in response to respective control bits stored in the shadow registers 306. The test resources 302 can include different types. One or more of the test resources 302 may be digital test resources. A digital test resource can provide a source, sink, or both of a digital test signal in response to a digital control signal. For example, the test resources 302-1 and 302-2 may be digital test resources configured to receive digital control signals from the shadow registers 306-1, and shadow registers 306-2 and 306-3, respectively. The test resources 302-1 and 302-2 can source, sink, or both digital test signals (TS-1 and TS-2).

One or more of the test resources 302 may be analog test resources. An analog test resource can provide a source, sink, or both of an analog test signal in response to a digital control signal. For example, the test resource 302-3 may be an analog test resource. The test resource 302-3 may include mixed signal electronics for sourcing, sinking, or both an analog test signal in response to a digital control signal from the shadow register 306-4. Such mixed signal electronics can include a digital-to-analog converter (DAC) 308, an analog-to-digital converter (ADC) 310, or both. The test resource 302-3 can source, sink, or both an analog test signal (TS-3).

One or more of the test resources 302 may be a power test resource. A power test resource can provide a source of voltage in response to a digital control signal. The source voltage can be received from a power source (e.g., the test instruments) and selectively provided to the DUT in response to a digital control signal. For example, the test resource 302-4 can be a power test resource configured to receive a voltage supply from a test instrument signal and a digital control signal from the shadow register 306-5. The test resource 302-4 can source the voltage supply of the test instrument signal as the test signal (TS-4) in response to the digital control signal from the shadow register 306-5. For example, the test resource 302-4 may include a switch, such as a relay, three-state buffer, of the like capable of switching the voltage supply. Although the test resource 302-4 is described as a power test resource that receives a voltage supply from the test instrument signal, it is to be understood that the test instrument signal can provide other types of resources, such as digital or analog resources. In such case, the test resource 302-4 can selectively switch the digital or analog signal in the same manner as the voltage supply signal. The types of test resources shown in FIG. 3 are merely exemplary, as there are a myriad of possible configurations of digital, analog, and power test resources.

In operation, the test resources 302 can be controlled by serially shifting a test control signal into the shift register 304. The test control signal may be shifted into the shift register 304 in accordance with a clock signal at the clock input. The test control signal may be shifted through the shift register 304 and out the test control output to the next control group in a chain. The clock signal at the clock input may be provided to the next control group in the chain. The test control signal can be shifted such that a frame is stored in each shift register in a chain. While the test control signal is being shifted through the shift register 304, the shadow register 306 can be disabled. When shifting is complete, the register control signal can be used to enable the shadow registers 306 for reading from the shift register 304, causing the frame stored in the shift register 304 to be parallel shifted into the shadow registers 306. After transfer, the register control signal can be used to again disable the shadow registers 306. The register control signal can be provided to the next control group in a chain.

The register control signal can also be used to enable the shadow registers 306 for reading from one or more of the test resources 302. After transfer, the register control signal can be used to again disable the shadow registers 306. Then, the shift register 304 can read from the shadow registers 306 in parallel fashion. The contents of the shift register 304 can then be read out serially. Such an operation may be referred to as readback and allows for the capture of test result signals from the DUT.

Figure 4:
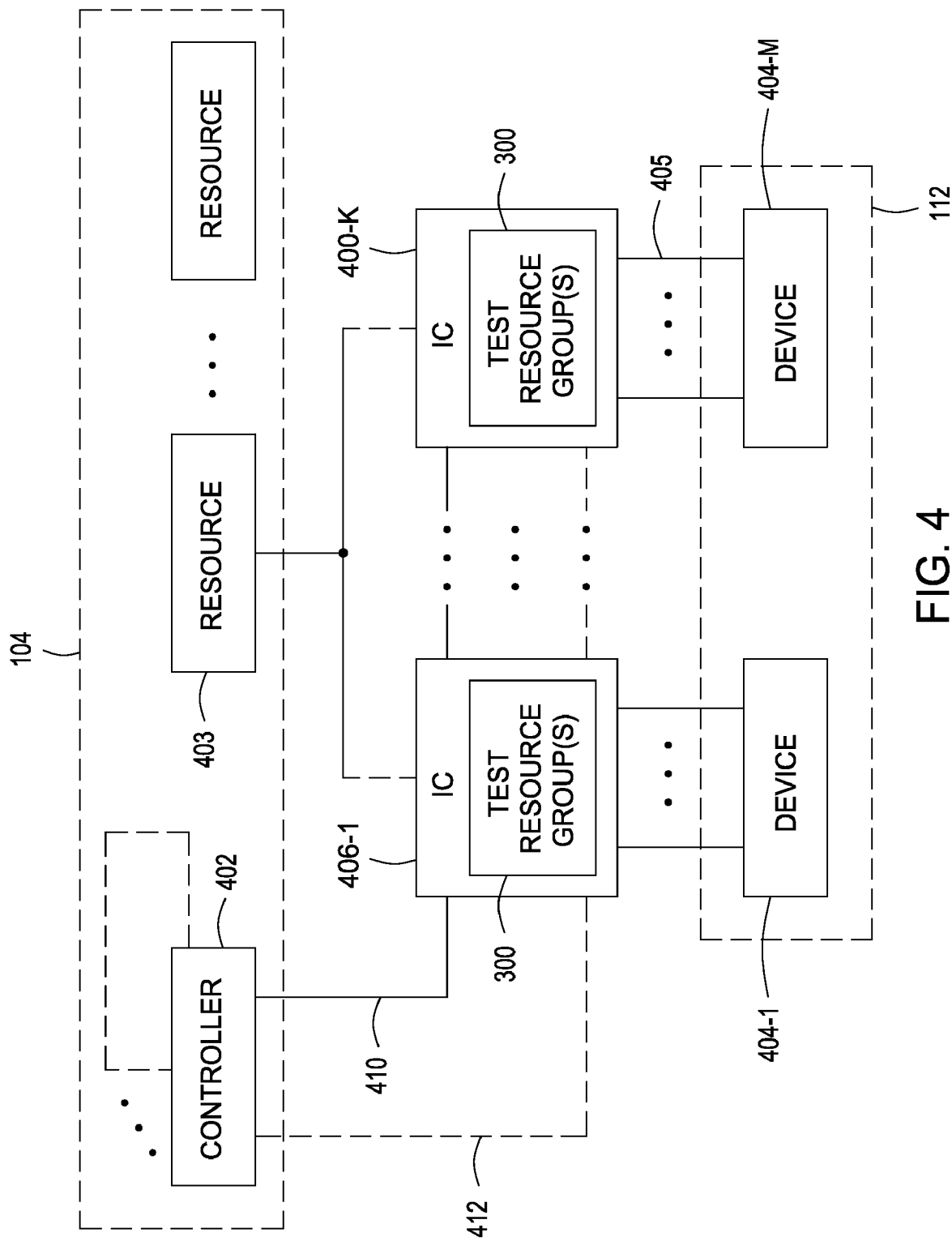
FIG. 4 is a circuit diagram depicting components on a probe card assembly according to some embodiments of the invention.

FIG. 4 is a circuit diagram depicting components on a probe card assembly 114 according to some embodiments of the invention. The test instruments 104 can include at least one controller 402. In the example shown, the DUT 112 can include a set of devices 404-1 through 404-M (generally referred to as devices 404), where M is an integer greater than one. That is, the DUT 112 can include multiple test sites (devices to be tested).

The controller 402 may be coupled to one or more ICs 406 for providing one or more test control signals thereto. In the present example, ICs 406-1 through 406-K are shown, where K is an integer greater than zero. Each of the ICs 406 can include one or more control groups of test resources, similar to the control group 300 shown in FIG. 3. The ICs 406 include test circuits that can have several configurations. In some embodiments, the ICs 406 can include a plurality of ICs serially coupled to form a chain of ICs. Each of the ICs 406 in the chain may include a control group 300 of test resources. The IC chain is configured such that the test resource control groups are serially coupled to form a chain of control groups. In some embodiments, each of the ICs 406 includes a plurality of control groups 300. The multiple control groups 300 in a given IC 406 may be serially coupled to form a chain, which in turn may be part of a bigger chain. The multiple control groups 300 in a given IC 406 may be in parallel or may form multiple serially coupled chains in parallel. Thus, a chain of ICs may include multiple chains of test resource control groups in parallel. In some embodiments, only a single IC 406 is provided having one or more control groups 300. In the single IC 406, multiple control groups may be serially coupled to form a chain, or there may be multiple serially coupled chains of control groups.

In some embodiments, the test resources in the ICs 406 may include a first chain and a second chain. The first chain of test resources may be responsive to a first test control signal, and the second chain of test resources may be responsive to a second test control signal. The first chain of test resources may include digital resources. The second chain of test resources may include power resources, analog resources, or both power and analog resources. Having separate chains of test resources for digital and power/analog resources can allow for higher data bandwidth for the digital resources.

The ICs 406 can be in communication with the devices 404 through temporary pressure connections 405. The temporary pressure connections may be effected using test probes, as described above. In some embodiments, there may be an IC 406 for each of the devices 404. In some embodiments, an IC 406 may be in communication with one or more of the devices 404. At least one of the test resources in at least one control group 300 in an IC 406 may source a test signal to a device 404 through a test probe. At least one of the test resources in at least one control group 300 in an IC 406 may sink a test signal from a device 404 through a test probe. At least one of the test resources in at least one control group 300 in an IC 406 may both source and sink test signals to and from a device 404 through at test probe.

In some embodiments, at least one test resource in at least one control group 300 in an IC 406 is coupled to receive a test signal from a resource 403 in the test instruments 104. The test instruments 104 can generally include a plurality of resources 403. The resources in the test instruments may include any combination of power resources, digital resources, and/or analog resources. A test resource in a control group 300 may be configured to selectively switch a test signal from a resource 403 in the test instruments 104. Accordingly, some of the test resources (e.g., digital or analog test resources) in the ICs 406 can source test signals based on only a test control signal from a controller 402. Others of the test resources (e.g., digital, analog, or power resources) in the ICs 406 can source test signals based on both a test signal from a resource 403 and a test control signal from the controller 402.

A controller 402 can be coupled to a serial input of the IC 406-1 through at least one serial interface 410. In case multiple ICs 406 are present, a serial output of the IC 406-1 can be coupled to a serial input of the IC 406-2, a serial output of the IC 406-2 can be coupled to a serial input of the IC 406-3, and so on to form the serial chain that propagates the serial interface(s) 410. The serial interface(s) 410 can include a serial interface for each chain of control groups 300 implemented by the ICs 406. The controller 402 can also be coupled to the IC 406-1 through at least one interface 412 for providing clock and/or other control signals (e.g., register control signal of FIG. 3) to the control groups 300. Thus one or more serial control lines can be used to control communication of test signals between test resources and the devices 504 in the DUT 112. The number of serial control lines may be much less than the number of test resources and associated test signals. Use of the single control line(s) can substantially reduce the number of routing resources needed on the probe card assembly to control such communication of test signals. This in turn reduces the cost to manufacture the probe card assembly.

In the present example, a single chain of ICs 406 is shown. In some embodiments, multiple chains of ICs may be provided. In such embodiments, the controller(s) 408 may include a plurality of serial interfaces 410 for serially controlling a plurality of IC chains 406.

Figure 5:
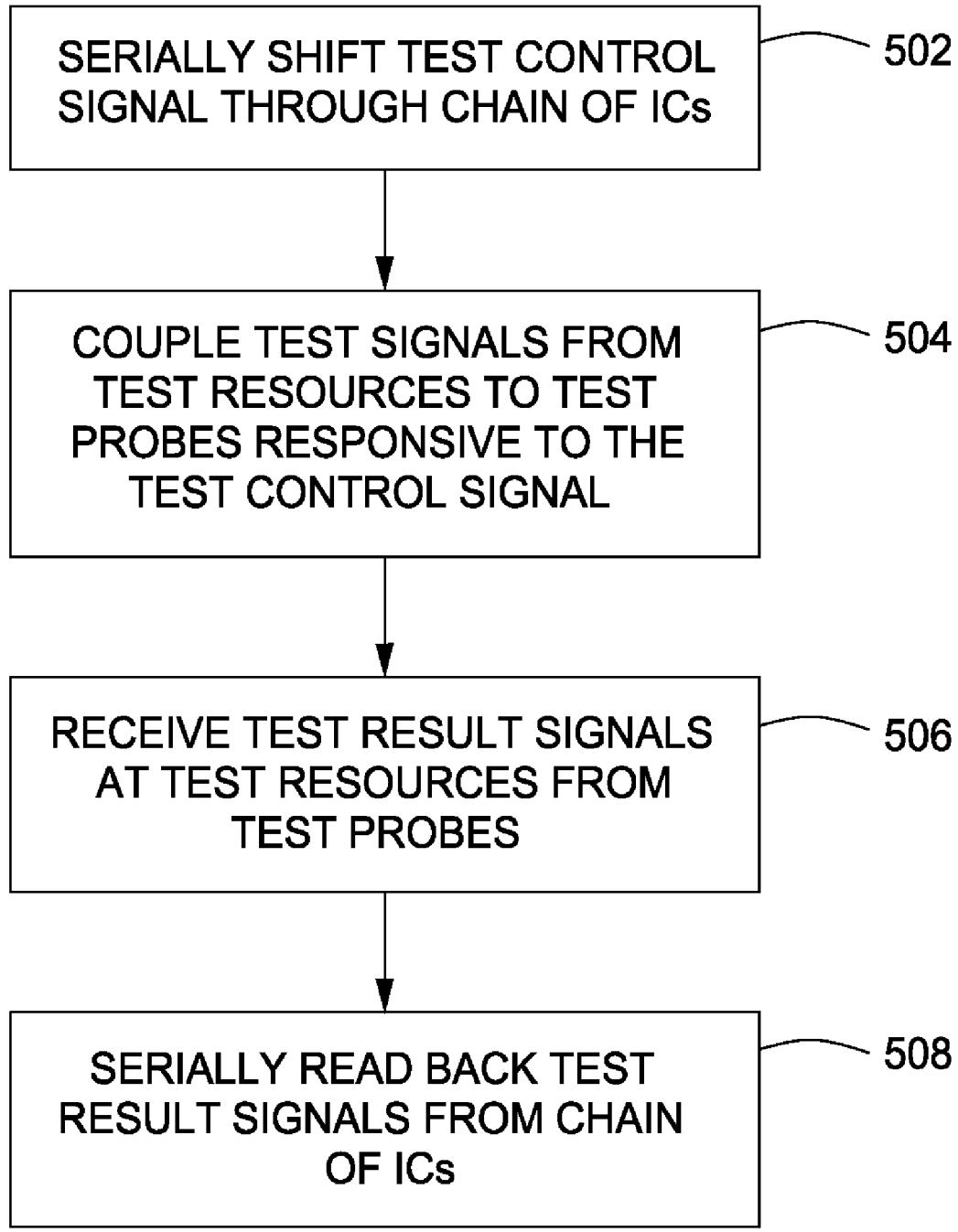
FIG. 5 is a flow diagram depicting a method of testing components on a wafer using a probe card assembly according to embodiments of the invention.

FIG. 5 is a flow diagram depicting a process 500 of testing components on a wafer using a probe card assembly according to some embodiments of the invention. In the process 500, a test control signal can be serially shifted through a chain of ICs (block 502). In some embodiments, a frame of the test control signal can be serially shifted into a shift register in each of the ICs. Bits of the frame can be parallel shifted into shadow registers coupled to a plurality of the test resources.

Test signals may be coupled from test resources to test probes responsive to the test control signal (block 504). In some embodiments, the test signals include at least one digital test signal sourced by at least one digital test resource. In some embodiments, the test signals include at least one analog test signal sources by at least one analog test resource. In some embodiments, the test signals include at least one power resource sourced by at least one power test resource. In some embodiments, the test signals include at least one test signal generated by at least one test resource in the at least one IC. In some embodiments, the test signals include at least one test signal switched by at least one test resource in the at least one IC. In some embodiments, a plurality of the test signals is generated or switched at a plurality of the test resources responsive to bits in shadow registers in each of the ICs.

In some embodiments, test result signals may be received at the test resources from the test probes (block 506). The test results may be digital or analog results received by respective digital or analog test resources. In some embodiments, captured test result signals are serially shifted through the chain of ICs and provided as output (e.g., to test instruments) (block 508).

Thus, methods and apparatus for testing devices using serially controlled test resources have been described. The test resources may be included in ICs, which are coupled to form a serial chain of ICs. Each of the test resources may be independently controlled using a serial interface to the chain of ICs. Hence, one or more serial control lines may be used to control a multiplicity of test resources. The test resources may include digital resources, analog resources, power resources, or a combination of digital, analog, and/or power resources. Test result data produced by a DUT may be captured by the chain of ICS and read back over the serial interface. This resource-by-resource readback capability can assist in the process of fault isolation among devices under test.

While the foregoing is directed to embodiments of the present invention, other and further embodiments of the invention may be devised without departing from the basic scope thereof, and the scope thereof is determined by the claims that follow.

The invention claimed is:

1. An apparatus for testing a device under test (DUT), comprising:
 an integrated circuit (IC) having a serialized input coupled to test circuits, the test circuits selectively communicating test signals with the DUT responsive to a test control signal on the serialized input,
 wherein the test circuits comprise:
  a shift register, coupled to the serialized input, configured to store bits of the test control signal; and
  test resources, coupled to the shift register, configured to provide at least one of a source or a sink of the test signals responsive to the bits.

2. The apparatus of claim 1, wherein each of the test resources comprises one of a digital resource, an analog resource, or a power resource.

3. The apparatus of claim 1, wherein at least one of the test resources is configured to generate a respective at least one of the test signals responsive to at least one of the bits.

4. The apparatus of claim 1, wherein at least one of the test resources is configured to switch a respective at least one of the test signals responsive to at least one of the bits.

5. The apparatus of claim 1, wherein at least one of the test resources comprises a digital resource.

6. The apparatus of claim 1, wherein at least one of the test resources comprises an analog resource.

7. The apparatus of claim 1, wherein at least one of the test resources comprises a power resource.

8. The apparatus of claim 1, wherein at least one of the test resources is a controllable source of test signals to the DUT.

9. A probe card assembly, comprising:
 at least one serial control line providing a respective at least one test control signal; and
 a plurality of integrated circuits (ICs) serially coupled to form a chain, the chain coupled to the at least one serial control line, the plurality of ICs selectively communicating test signals between test resources and test probes responsive to the at least one test control signal,
 wherein each of the plurality of ICs comprises:
  at least one control group, each including:
   a shift register configured to store bits of a test control signal of the at least one test control signal; and
   a plurality of the test resources, coupled to the shift register, configured to provide at least one of a source or a sink of a plurality of the test signals responsive to the bits.

10. The probe card assembly of claim 9, wherein at least one of the plurality of the test resources is configured to generate a respective at least one of the plurality of the test signals responsive to at least one of the bits.

11. The probe card assembly of claim 9, wherein at least one of the plurality of the test resources is configured to switch a respective at least one of the plurality of the test signals responsive to at least one of the bits.

12. The probe card assembly of claim 9, wherein each of the test resources comprises one of a digital resource, an analog resource, or a power resource.

13. The probe card assembly of claim 9, wherein the at least one serial control line comprises a first serial control line providing a first test control signal and a second serial control line providing a second test control signal, and wherein the test resources in the plurality of ICs comprise a first chain of test resources responsive to the first test control signal and a second chain of test resources responsive to the second test control signal.

14. The probe card assembly of claim 13, wherein the first chain of test resources includes digital resources and the second chain of test resources includes power resources.

15. The probe card assembly of claim 9, wherein at least one of the test resources comprises a digital resource.

16. The probe card assembly of claim 9, wherein at least one of the test resources comprises an analog resource.

17. The probe card assembly of claim 9, wherein at least one of the test resources comprises a power resource.

18. The probe card assembly of claim 9, wherein at least one of the test resources is a controllable source of test signals to the test probes.

* * * * *